United States Patent

Rust

[11] Patent Number: 5,978,928
[45] Date of Patent: Nov. 2, 1999

[54] RELATIVE LOGARITHMIC TIME STAMPS FOR REDUCED MEMORY MAP SIZE

[75] Inventor: Robert A. Rust, Boise, Id.

[73] Assignee: Hewlett-Packard Company, Palo Alto, Calif.

[21] Appl. No.: 08/953,280

[22] Filed: Oct. 17, 1997

[51] Int. Cl.[6] .................................................. G06F 17/40
[52] U.S. Cl. ............................................ 713/502; 702/187
[58] Field of Search .......................... 395/557; 702/187; 713/500, 502, 600

[56] References Cited

U.S. PATENT DOCUMENTS

| | | | |
|---|---|---|---|
| 4,040,034 | 8/1977 | Belady et al. ............................. | 713/600 |
| 4,816,989 | 3/1989 | Finn et al. ...................... | 395/200.78 X |
| 5,010,560 | 4/1991 | Janney et al. ......................... | 702/187 X |
| 5,491,815 | 2/1996 | Basco et al. .............................. | 395/557 |
| 5,574,867 | 11/1996 | Khaira ...................................... | 395/293 |
| 5,649,110 | 7/1997 | Ben-Nun et al. .................... | 395/849 X |
| 5,651,113 | 7/1997 | Lin et al. .............................. | 713/500 X |
| 5,712,988 | 1/1998 | Khaira ...................................... | 395/293 |
| 5,734,876 | 3/1998 | Kowert ..................................... | 713/500 |
| 5,795,161 | 8/1998 | Vogel ....................................... | 434/350 |

Primary Examiner—Thomas M. Heckler

[57] ABSTRACT

A system and method for managing a time stamp wherein a table of time stamps is maintained. Each time stamp corresponds to the age of a block of data. The age of the data is determined from the value of the time stamp in the table. When a block of data is written, the time stamp corresponding to the data is individually reset by writing a zero to the stamped value. Each stamp is aged by updating the time stamps at predetermined time intervals. Aging a time stamp includes reading the time stamp, determining whether to advance the time stamp, and advancing the time stamp. A random number is generated for each time stamp. The random number is compared to an increment threshold value. If the random number matches the increment threshold value, the time stamp is incremented.

14 Claims, 3 Drawing Sheets

RELATIVE LOGARITHMIC TIME STAMPS FOR REDUCED MEMORY MAP SIZE

FIELD OF THE INVENTION

This invention relates, in general, to time stamping systems and, more particularly to, a system and method for managing a time stamping system using relative logarithmic time stamps.

BACKGROUND OF THE INVENTION

Time stamping systems have a variety of uses. Often these systems are used by computer systems to determine the age of data. A time stamp is associated with each block of data when the data is originally written or modified. The computer system reads the time stamp for a particular block of data in order to determine the age of the block of data. Once the age of the data is known, the computer system can decide whether to keep the data, erase the data, or store the data in a different format.

Conventional time stamp systems are absolute. Absolute time stamp systems initiate a time clock when power is supplied to the system for the first time. As each block of data is written, a time stamp is associated with the block of data and stamped with the time the data was written. To determine the age of a block of data, a computer system must read the block's associated time stamp and subtract the value of the time stamp from the current value of the time clock.

Additionally, conventional time stamp systems are linear. Linear time stamp systems increment time stamps with each update cycle. In order to provide a time stamp system with a sufficiently wide range of time stamps, a relatively large block of memory is needed for each time stamp. A typical relatively large block of memory is 20 bits for each time stamp.

SUMMARY OF THE INVENTION

According to principles of the present invention in a preferred embodiment, a system and method for managing a time stamp includes reading the time stamp, determining whether to advance the time stamp, and advancing the time stamp. A random number is generated for each time stamp. The random number is compared to an increment threshold value. If the random number matches the increment threshold value, the time stamp is incremented.

According to further principles of the present invention, the system waits for an update cycle to begin. During the update cycle, all of the time stamps are updated. After all of the time stamps are updated, the system again waits for another update cycle to begin. This process continues to repeat while the system is in operation.

According to further principles of the present invention in a preferred embodiment, a lookup table includes predetermined increment threshold values for each possible value for the time stamp. The increment threshold values are determined from a desired frequency of advancement. The random number is compared to the increment threshold values in the lookup table.

Other objects, advantages, and capabilities of the present invention will become more apparent as the description proceeds.

DETAILED DESCRIPTION OF THE INVENTION

The present invention uses logarithmic offset-base time stamps. Each time stamp preferably only uses four bits of memory. Table 1 shows one possible example of the actual age of the data corresponding to each time stamp value.

TABLE 1

| Time Stamp Value | Age of Data |
| --- | --- |
| 0 | 10 minutes |
| 1 | 20 minutes |
| 2 | 40 minutes |
| 3 | 1 hour, 20 minutes |
| 4 | 2 hours, 40 minutes |
| 5 | 5 hours, 20 minutes |
| 6 | 10 hours, 40 minutes |
| 7 | 21 hours, 20 minutes |
| 8 | 1 day, 18 hours |
| 9 | 3 days, 13 hours |
| A | 7 days, 3 hours |
| B | 14 days, 5 hours |
| C | 28 days, 1 1 hours |
| D | 1 month, 26 days |
| E | 3 months, 23 days |
| F | 7 months or older |

Figure 1:
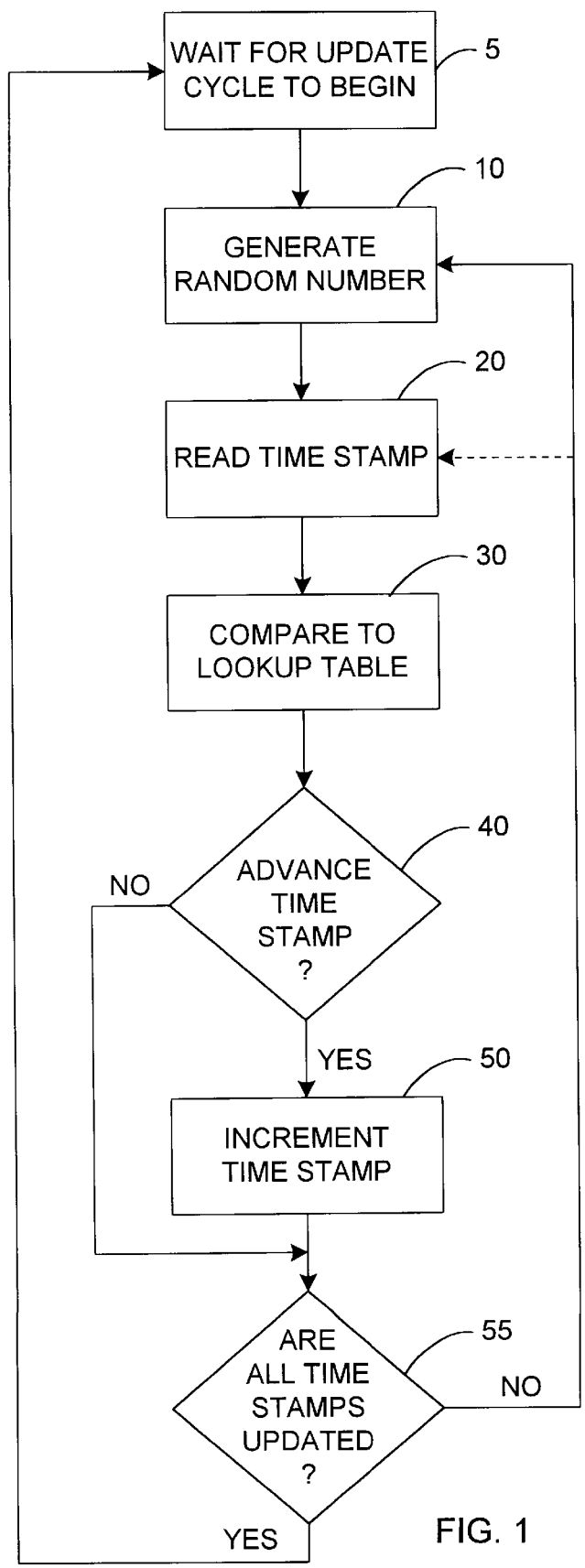
FIG. 1 is a block diagram of a preferred embodiment of the time stamp management method of the present invention.

FIG. 1 shows a preferred embodiment of the method for managing a time stamp of the present invention. The system of the present invention will process each time stamp at regular intervals. The intervals are typically equally spaced and between 8 and 10 minutes. Table 1 uses 10 minute increments. The system will wait 5 until an update cycle begins. After an update cycle timer expires, each time stamp is updated. For each time stamp, a random number is generated 10. Alternatively, only one random number is generated for all time stamps. The random number will be in binary format and will have a certain number of consecutive zeros starting from the lowest order bit. The time stamp is then read 20 from its location in memory. Next, a lookup table is used to determine a minimum run length of zeros of the random number in order to advance the time stamp. Table 2 is a sample lookup table. Table 2 also includes the probability of advancement for each time stamp value. The probability is included in Table 2 for the purpose of clarity and would not typically be included in a lookup table.

TABLE 2

| Time Stamp Value | Minimum Number of Zeros for Advancement | Probability of Advancement |
| --- | --- | --- |
| 0 | 0 | 1 in 1 |
| 1 | 1 | 1 in 2 |
| 2 | 2 | 1 in 4 |
| 3 | 3 | 1 in 8 |
| 4 | 4 | 1 in 16 |
| 5 | 5 | 1 in 32 |
| 6 | 6 | 1 in 64 |
| 7 | 7 | 1 in 128 |
| 8 | 8 | 1 in 256 |
| 9 | 9 | 1 in 512 |
| A | 10 | 1 in 1,024 |
| B | 11 | 1 in 2,048 |

TABLE 2-continued

| Time Stamp Value | Minimum Number of Zeros for Advancement | Probability of Advancement |
| --- | --- | --- |
| C | 12 | 1 in 4,096 |
| D | 13 | 1 in 8,192 |
| E | 14 | 1 in 16,384 |
| F |  | None |

After comparing 30 the random number to the lookup table, the present invention determines 40 whether to advance the time stamp. A match between the random number and the minimum number of zeros for advancement indicates that the time stamp is advanced 50. Preferably the random number is in binary format. A match between the random number and the minimum number of zeros is preferably determined by comparing the minimum number of zeros with the number of consecutive zeros in the random number beginning with the lowest order bit. If there is no match, the time stamp is not advanced and the increment step 50 is skipped.

After the increment step 50, the system determines 55 whether all of the time stamps have been updated. If all time stamps have been updated, the system again waits 5 for an update cycle to begin and the process is repeated.

If not all time stamps have been updated, a random number is again generated 10, and the next time stamp is updated. The process then loops until all time stamps have been updated. Alternatively (shown with dashed line), if not all time stamps have been updated, the next time stamp is read 20 and then updated. The process then loops until the remaining time stamps are updated, each using the same random number.

When new data is written to a block, the time stamp is reset by writing a zero value to the time stamp. If data is written while the time stamp is being updated, the command to write the zero value to the time stamp has priority over a command to advance the time stamp.

Typically, the accuracy of the time stamp becomes less important as the data ages. Since the accuracy of the time stamp becomes less important, the present invention time stamp management system and method allow the time stamp value to become less accurate as the data ages. As can be ascertained from Table 2 and the rules of probability, the older the data becomes, the less accurate the time stamp value will become. For example, a young time stamp may have a value of 24 hours give or take an hour, but a one-month-old time stamp may be within 2 days of the correct time.

Figure 2:
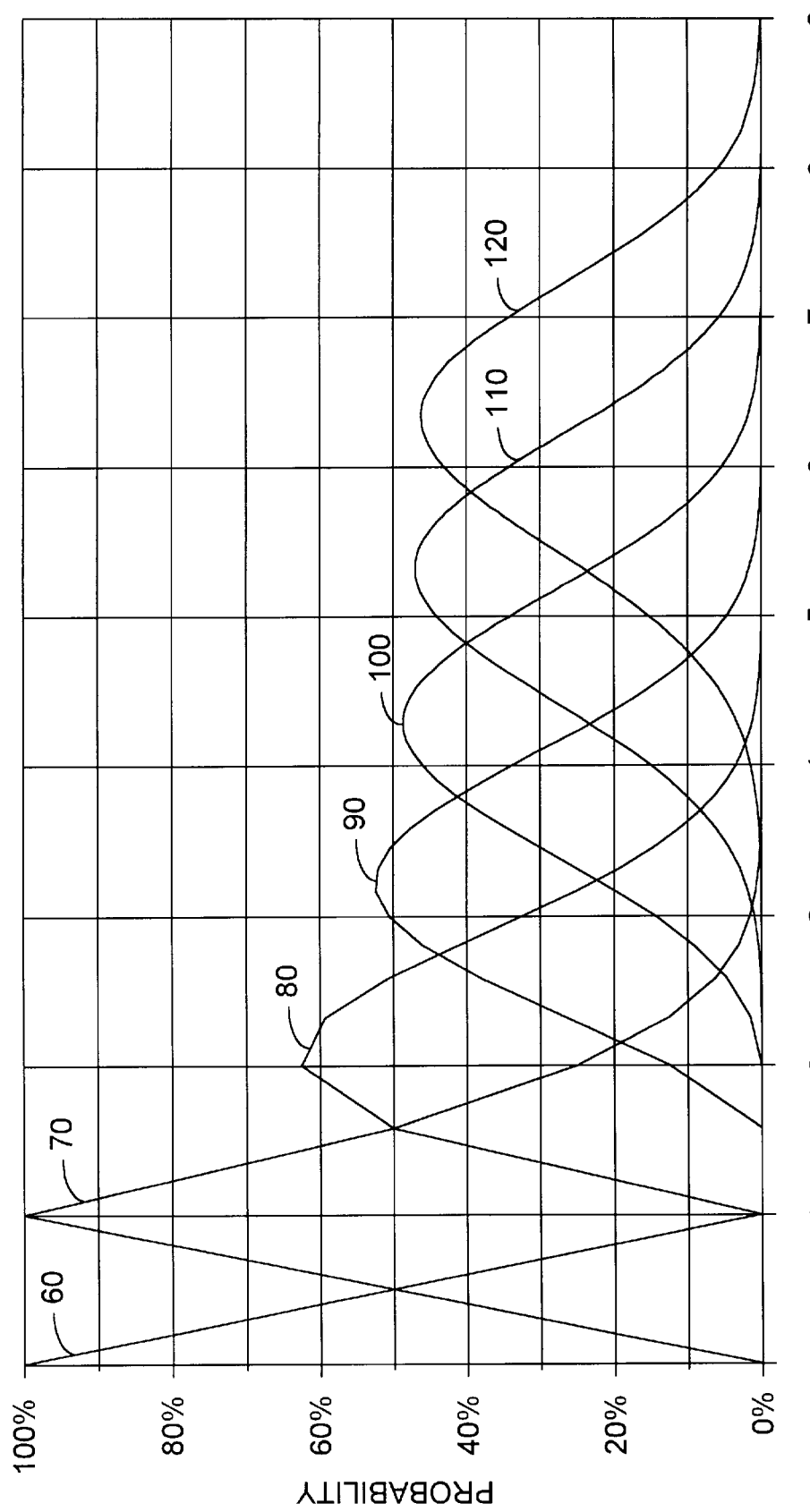
FIG. 2 is a graph showing the probability of a time stamp occurring at a particular time after being written.

FIG. 2 shows the probability of a time stamp value occurring at different times after the data is time stamped. Time is represented in FIG. 2 by time stamp values shown in Table 1. For example, a 1 in FIG. 2 represents 10 minutes and a 2 represents 40 minutes. Curve zero 60 shows the probability of a time stamp having a value of 0 for each time. Similarly, curve one 70 shows the probability of a time stamp having a value of 1 for each time. The remaining curves show the probability of a time stamp having the value indicated by the curve for each time. For clarity, only curves zero 60, one 70, two 80, three 90, four 100, five 110, and six 120 are included in FIG. 2. Other curves representing other time stamp values may be generated from the probabilities listed in Table 2.

Curve zero 60 shows that all time stamps begin at 0 for time zero. After the first update cycle, all data is incremented to 1. The duration between each update cycle is 10 minutes in the example shown in FIG. 2. Curve one 70 shows that at 10 minutes, all data has a time stamp of 1. Since the probability for advancement for a 1 time stamp is 1 in 2, curve one 70, shows that 50% of all time stamps have a value of 1 at the second update cycle. Also, curve two 80 shows that the other 50% of the time stamps will have a value of 2 at the second update cycle.

Curve one 70 continues to decrease by on half with each update cycle. At 40 minutes (time 2 in FIG. 2) curve one 70 has a value of 25%. As curve one 70 decreases, the other curves first begin to increase then also to decrease.

Curve two 80 increases by an amount equal to the amount which curve one 70 decreases. This increase is because each time a time stamp with a value of 1 is increased, it becomes a time stamp with a value of 2. Curve two 80 decreases at a rate of one fourth with each update cycle.

Curve three 90 increases by an amount equal to the amount which curve two 80 decreases. The same pattern applies to the remaining curves. Additionally, each of the curves decreases by at the rate indicated in Table 2 by the Probability of Advancement. Note that each curve is shorter and wider than the previous curve. The area under each curve is the same as the area under each other curve.

Figure 3:
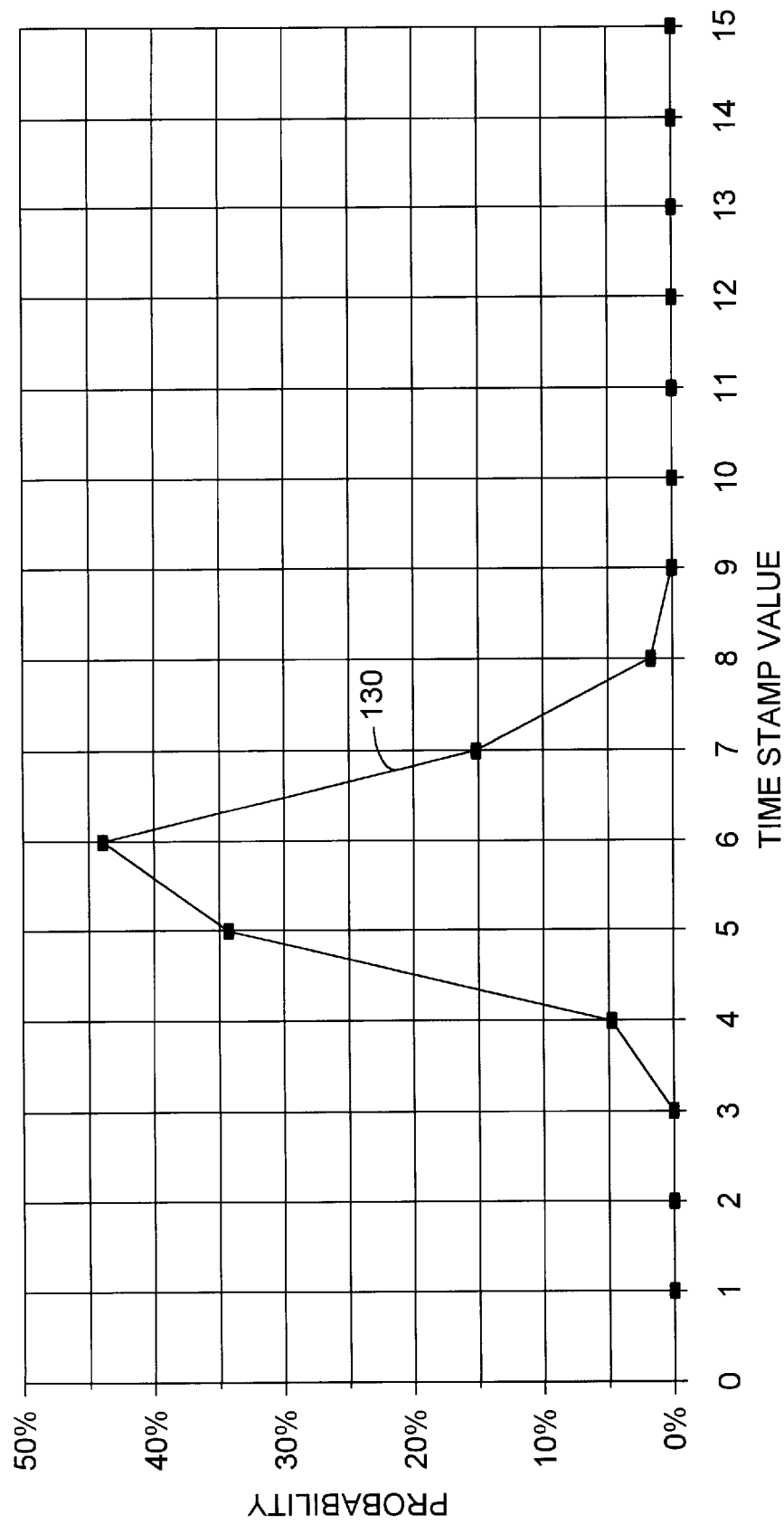
FIG. 3 is a graph showing the probability of a time stamp having a particular value at a specific time after being written.

FIG. 3 is a graph of curve 130 showing the probability of a time stamp having a particular value at a time of 10 hours and 40 minutes after the data is time stamped. Time 6 in FIG. 2 represents a time of 10 hours and 40 minutes. At that time, the time stamp has about a 5% probability of having a value of 4, a 34% probability of having a value of 5, a 43% probability of having a value of 6, a 15% probability of having a value of 7, and a 2% probability of having a value of 8. Since a time stamp value of 6 represents an age of 10 hours and 40 minutes, a 6 would be the most accurate time stamp value. The other time stamp values are not as accurate. However, as noted above, absolute accuracy is not required.

In summary, what has been described above are the preferred embodiments for a system and method for managing time stamps. While the present invention has been described by reference to specific embodiments, it will be obvious that other alternative embodiments and methods of implementation or modification may be employed without departing from the true spirit and scope of the invention.

What is claimed is:

1. A system for managing at least one time stamp, the system comprising:
   (a) means for reading each of the time stamps;
   (b) determining means for determining from each time stamp whether to advance each time stamp; and,
   (c) means, responsive to the determining means, for advancing each time stamp.

2. The system of claim 1 further including means for generating corresponding random numbers for each of the time stamps, wherein the determining means includes means for determining from each time stamp and each corresponding random number whether to advance each time stamp.

3. The system of claim 2 wherein the determining means includes:
   (a) a lookup table having a plurality of time stamp values and a plurality of increment threshold values, each of the increment threshold values associated with one of the time stamp values;
   (b) means for matching each time stamp to one of the time stamp values of the lookup table;

(c) means for comparing each corresponding random number to each increment threshold value associated with each matching time stamp value; and, wherein each time stamp is advanced when the corresponding random number equals the associated increment value.

4. The system of claim 1 further including means for generating a random number, wherein the determining means includes means for determining from the random number and each time stamp whether to advance each time stamp.

5. The system of claim 4 wherein the determining means includes:

(a) a lookup table having a plurality of time stamp values and a plurality of increment threshold values, each of the increment threshold values associated with one of the time stamp values;

(b) means for matching each time stamp to one of the time stamp values of the lookup table;

(c) means for comparing the random number to each increment threshold value associated with each matching time stamp value; and, nwherein each time stamp is advanced when the random number equals the associated increment value.

6. A method for managing at least one time stamp, the method comprising:

(a) reading each time stamp;

(b) determining from each time stamp whether to advance each time stamp; and, (c) advancing each time stamp, responsive to the determination.

7. The method of claim 6, further including generating corresponding random numbers for each of the time stamps, wherein the determining includes determining from each time stamp and each corresponding random number whether to advance each time stamp.

8. The method of claim 7, wherein the determining includes:

(a) matching each time stamp to one of the time stamp values in a lookup table;

(b) comparing each corresponding random number to each increment threshold value associated with the matching time stamp value; and, wherein each time stamp is advanced when the corresponding random number equals the associated increment value.

9. The method of claim 6, further including generating a random number, wherein the determining includes determining from the random number and each time stamp whether to advance each time stamp.

10. The method of claim 9, wherein the determining includes:

(a) matching each time stamp to one of the time stamp values in a lookup table;

(b) comparing the random number to each increment threshold value associated with each matching time stamp value; and, wherein each time stamp is advanced when the random number equals the associated increment value.

11. A system for managing time stamps, the system comprising:

(a) memory means for storing a first time stamp;

(b) means for retrieving the first time stamp from the memory means;

(c) determining means for determining from the first time stamp whether to increment the first time stamp; and, (d) advancing means, responsive to the determining means, for advancing the first time stamp.

12. The system of claim 11 further including means for generating a random number, wherein the determining means includes means for determining from the random number and the first time stamp whether to advance the first time stamp.

13. The system of claim 12 wherein the determining means includes:

(a) a lookup table having a plurality of time stamp values and a plurality of increment threshold values, each of the increment threshold values associated with one of the time stamp values;

(b) means for matching the first time stamp to one of the time stamp values of the lookup table;

(c) means for comparing the random number to the increment threshold value associated with the matching time stamp value; and wherein the first time stamp is advanced when the random number equals the increment value.

14. The system of claim 11 wherein the advancing means includes means for storing a second time stamp to the memory means in place of the first time stamp, wherein the second time stamp is greater in value than the first time stamp.

\* \* \* \* \*